US011860257B2

(12) United States Patent
Polak et al.

(10) Patent No.: US 11,860,257 B2
(45) Date of Patent: Jan. 2, 2024

(54) METHOD FOR ACQUIRING A THREE-DIMENSIONAL MAGNETIC RESONANCE IMAGE DATASET AND FOR GENERATING A MOTION-CORRECTED IMAGE DATASET

(71) Applicant: Siemens Healthcare GmbH, Erlangen (DE)

(72) Inventors: Daniel Polak, Erlangen (DE); Stephen Farman Cauley, Somerville, MA (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/715,391

(22) Filed: Apr. 7, 2022

(65) Prior Publication Data

US 2022/0326330 A1  Oct. 13, 2022

(30) Foreign Application Priority Data

Apr. 9, 2021 (EP) .................................... 21167589

(51) Int. Cl.
*G01V 3/00* (2006.01)
*G01R 33/565* (2006.01)
*G01R 33/48* (2006.01)
*G01R 33/561* (2006.01)

(52) U.S. Cl.
CPC ... *G01R 33/56509* (2013.01); *G01R 33/4818* (2013.01); *G01R 33/5611* (2013.01); *G01R 33/5615* (2013.01)

(58) Field of Classification Search
CPC .......... G01R 33/56509; G01R 33/4818; G01R 33/5611; G01R 33/5615; G01R 33/4822; G01R 33/4826
USPC ........................................................ 324/309
See application file for complete search history.

(56) References Cited

U.S. PATENT DOCUMENTS

| | | | |
|---|---|---|---|
| 9,317,917 B2 * | 4/2016 | Stemmer | ................. G06T 5/001 |
| 2009/0082656 A1 | 3/2009 | Bayram et al. | |
| 2010/0117644 A1 | 5/2010 | Nimbargi et al. | |
| 2015/0097565 A1 | 4/2015 | Basha et al. | |
| 2021/0373105 A1 | 12/2021 | Polak et al. | |
| 2022/0065971 A1 | 3/2022 | Polak et al. | |

OTHER PUBLICATIONS

Haskell, Melissa W. et al. "Network Accelerated Motion Estimation and Reduction (NAMER): Convolutional neural network guided retrospektive motion correction using a separable motion model", Magn. Reson. Med, vol. 82, pp. 1452-1461, 2019 // DOI: 10.1002/mrm.27771.

(Continued)

*Primary Examiner* — Walter L Lindsay, Jr.
(74) *Attorney, Agent, or Firm* — Harness, Dickey & Pierce, P.L.C.

(57) ABSTRACT

A three-dimensional magnetic resonance image dataset of an object is acquired using a multi-shot imaging protocol in which several k-space lines are acquired in one shot. The three-dimensional k-space includes a central region and a periphery, wherein the sampling order of k-space lines differs between the central region and the periphery. At least one k-space line from each shot passes through the central (Continued)

region, whereas the periphery includes regions, which are sampled by k-space lines from a subset of the plurality of shots.

20 Claims, 9 Drawing Sheets

(56) References Cited

OTHER PUBLICATIONS

Polak D. et al: "Scout Acquisition enables rapid Motion Estimation (SAMER) for fully separable retrospective motion mitigation,", in Proceedings of ISMRM 28th Annual Meeting, 2020.
Haskell, M. W. et al. "TArgeted Motion Estimation and Reduction (TAMER): Data Consistency Based Motion Mitigation for MRI using a Reduced Model Joint Optimization" IEEE, vol. 37, Nr. 5, pp. 1253-1265, 2018 // DOI 10.1109/TMI.2018.2791482.
Kangrong, Zhu et al: "Simultaneous Multi-slice Flyback Echo Planar Imaging with Auto-calibration"; Proceedings of the International Society for Magnetic Resonance in Medicine, ISMRM, 21st Annual Meeting and Exhibition, Salt Lake City, Utah, USA, Apr. 20-26, 2013; No. 0125, Apr. 7, 2013 (Apr. 7, 2013), XP040627726.
Akcakaya, Mehmet et al: "Accelerated contrast-enhanced whole-heart coronary MRI using low-dimensional-structure self-learning and thresholding"; Magnetic Resonance in Medicine; vol. 67, No. 5, Mar. 5, 2012 (Mar. 5, 2012), pp. 1434-1443, XP055159091.
Cordero-Grande, Lucilio et al. "Sensitivity Encoding for Aligned Multishot Magnetic Resonance Reconstruction" IEEE Transactions on Computational Imaging, vol. 2, No. 3, Sep. 2016, pp. 266-280.
Hamilton, Jesse et al: "Recent advances in parallel imaging for Mri"; Progress in Nuclear Magnetic Resonance Spectroscopy; vol. 101, May 2, 2017 (May 2, 2017), pp. 71-95, XP085170513.
Pruessmann, P. Klaas et al: "SENSE: Sensitivity encoding for Fast MRI", in: Magn. Reson. Med., vol. 42, pp. 952-962, 1999.
Uecker, Martin et al: "ESPIRiT—An Eigenvalue Approach to Autocalibrating Parallel MRI: Where Sense Meets GRAPPA"; in Magnetic Resonance in Medicine; vol. 71; pp. 990-1001; 2014.
Cordero-Grande L et al: "Three-dimensional motion corrected sensitivity encoding reconstruction for multi-shot multi-slice MRI: Application to neonatal brain imaging," Magn. Reson. Med., vol. 79, No. 3, pp. 1365-1376, 2018.
Cordero-Grande L. et al: "Motion-corrected MRI with DISORDER: Distributed and incoherent sample orders for reconstruction deblurring using encoding redundancy", Magn Reson Med. 2020; 84:713-726.
Bilgic, Berkin et al. "Wave-CAIPI for Highly Accelerated 3D Imaging" Magnetic Resonance in Medicine, vol. 73, No. 6, pp. 2152-2162, 2015 // DOI: 10.1002/mrm.25347.

\* cited by examiner

FIG 12
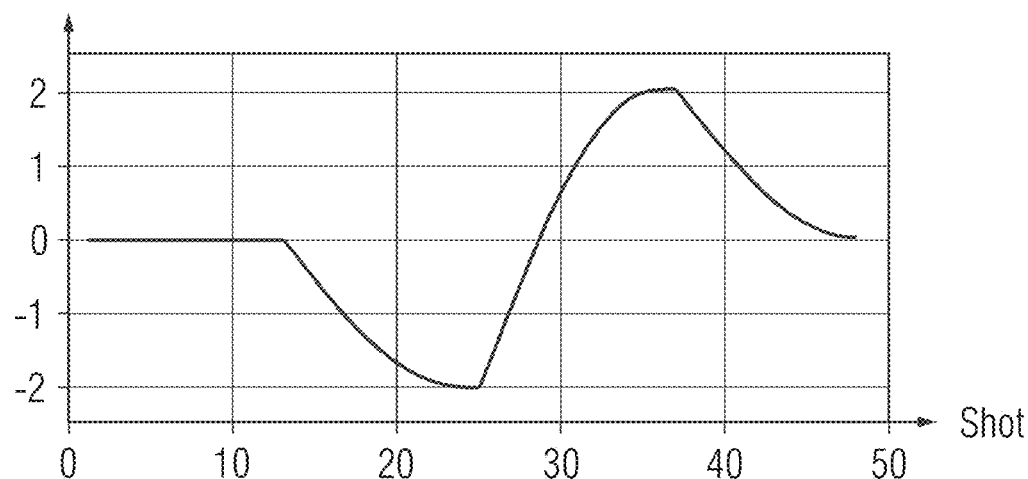
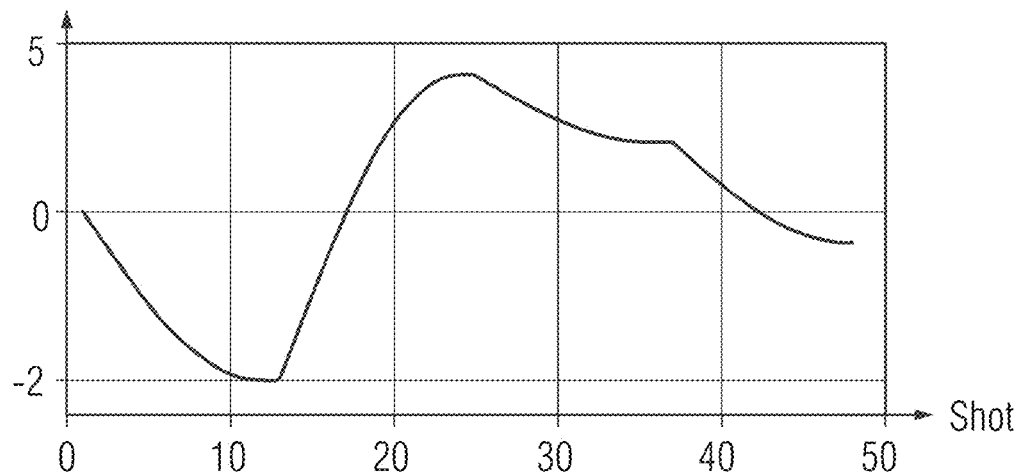

FIG 13
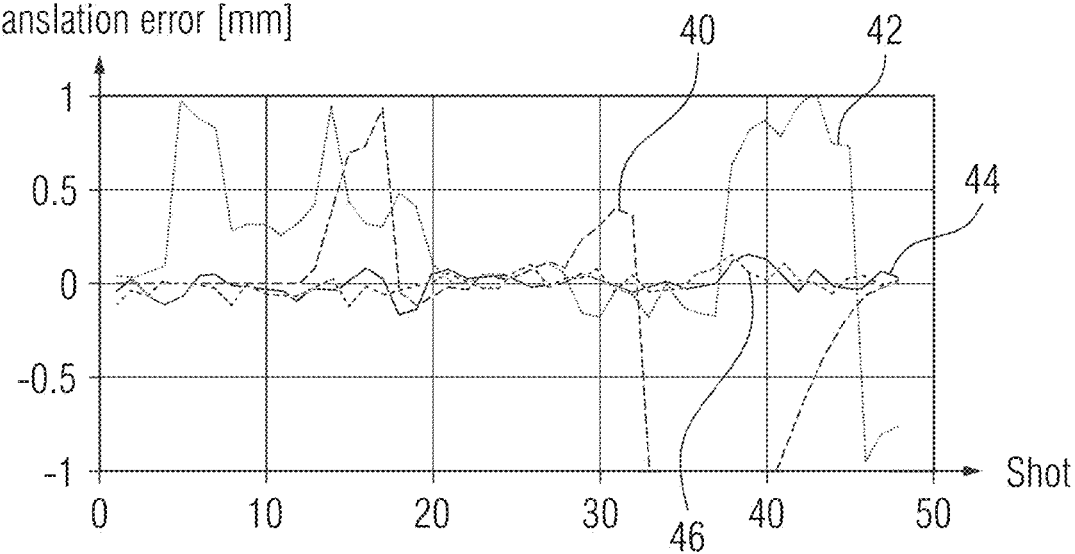
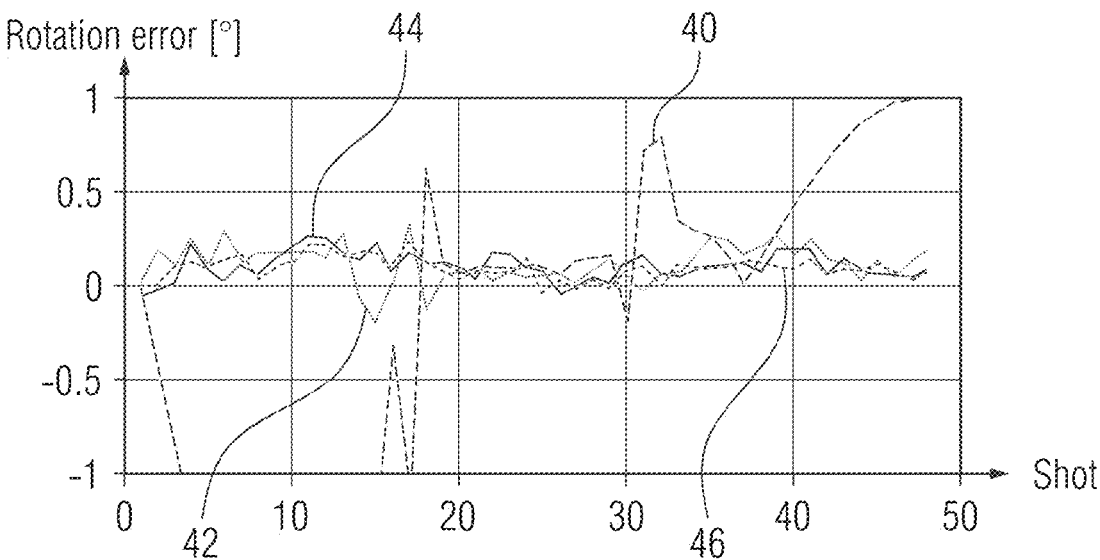

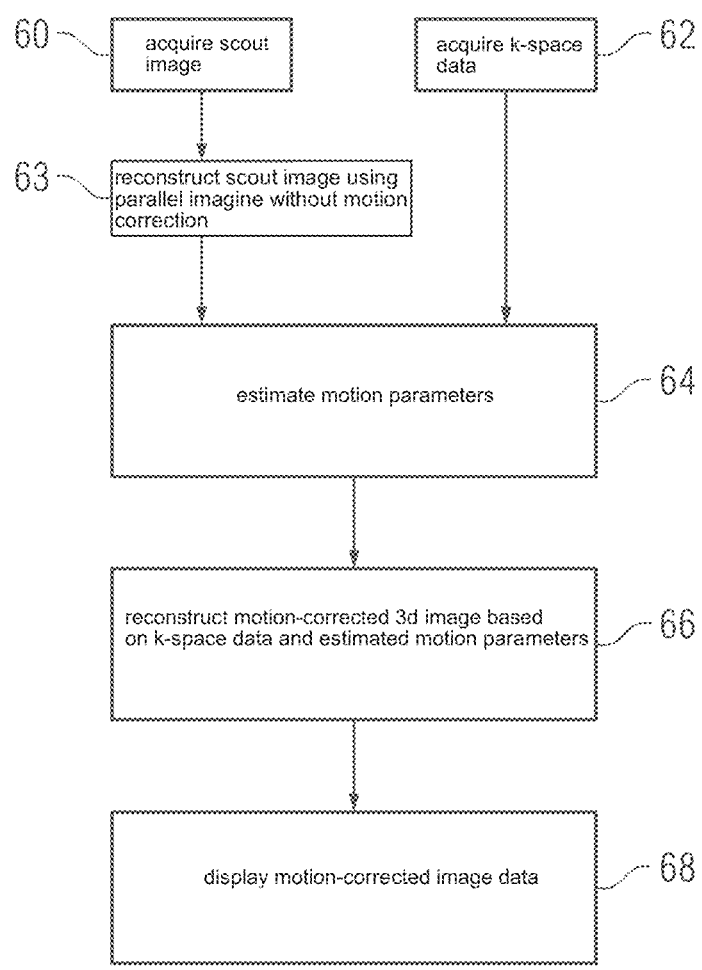

METHOD FOR ACQUIRING A THREE-DIMENSIONAL MAGNETIC RESONANCE IMAGE DATASET AND FOR GENERATING A MOTION-CORRECTED IMAGE DATASET

CROSS-REFERENCE TO RELATED APPLICATION(S)

The present application claims priority under 35 U.S.C. § 119 to European Patent Application No. EP 21167589.7, filed Apr. 9, 2021, the entire contents of which are incorporated herein by reference.

FIELD

Embodiments of the present invention relate to a method for acquiring a three-dimensional magnetic resonance image dataset of an object, and to a method for generating a motion-corrected image dataset from multi-channel k-space data acquired during such method. Embodiments of the present invention also relate to a magnetic resonance imaging apparatus, a computer and a computer-readable medium.

BACKGROUND

Patient motion can degrade the diagnostic quality of magnetic resonance (MR) exams. Fast imaging protocols may reduce the impact of motion. For example, parallel imaging techniques, as summarised in J. Hamilton, D. Franson, and N. Seiberich "Recent Advances in Parallel Imaging for MRI," Prog. Nucl. Magn. Reson. Spectrosc., vol. 101, pp. 71-95, 2017, exploit the properties of modern multi-channel coil arrays to separate aliased pixels in the image domain or to estimate missing k-space data, using knowledge of nearby acquired k-space points, in order to allow scan time reduction by sampling a smaller number of phase encoding lines in k-space.

Despite reduced motion sensitivity from faster scanning, these methods do not solve the problem caused by motion in emergency settings.

Retrospective methods correct for motion artifacts after the data acquisition without disruptions to the sequence timing or inclusion of additional hardware. By including motion operations into the MR forward model, these techniques account for the patient's motion in the final image reconstruction and therefore reduce motion artifacts through improved model agreement. Especially data-driven retrospective correction techniques allow for the motion data to be derived from the acquired multi-channel k-space data itself. This is feasible as the complex sensitivity profiles of multi-channel coil arrays inherently encode the patient position into the acquired k-space data. For multi-shot acquisitions, the goal is to extract the per shot rigid-body motion parameters and the motion-free image simultaneously. This can be accomplished by either minimizing an image quality metric, such as image entropy, or by minimizing the data consistency error of a parallel imaging+motion forward model, as described in L. Cordero-Grande, E. J. Hughes, J. Hutter, A. N. Price, and J. V Hajnal, "Three-dimensional motion corrected sensitivity encoding reconstruction for multi-shot multi-slice MRI: Application to neonatal brain imaging," Magn. Reson. Med., vol. 79, no. 3, pp. 1365-1376, 2018, J. Cordero-Grande, L., Teixeira, R., Hughes, E., Hutter, J., Price, A., & Hajnal, "Sensitivity Encoding for Aligned Multishot Magnetic Resonance Reconstruction," IEEE Trans. Comput. Imaging, vol. 2, no. 3, pp. 266-280, 2016 and M. W. Haskell, S. F. Cauley, and L. L. Wald, "TArgeted Motion Estimation and Reduction (TAMER): Data consistency based motion mitigation for mri using a reduced model joint optimization," IEEE Trans. Med. Imaging, vol. 37, no. 5, pp. 1253-1265, 2018. For the latter, the motion and image vector are jointly estimated via an inversion of the non-linear forward model. This corresponds to a large-scale non-linear optimization problem that is typically computationally very expensive using standard numerical methods. Previously proposed methods alternate between optimizing just the image or the motion parameters while assuming the other to be fixed (see L. Cordero-Grande in Magn. Reson. Med.), instead of updating all optimization variables at once. Nevertheless, repeated updates of the imaging voxels lead to excessive computation that prohibits it use in clinical settings.

Several attempts to improve the robustness and speed of this alternating scheme have been proposed. L. Cordero-Grande, G. Ferrazzi, R. P. A. G. Teixeira, J. O'Muircheartaigh, A. N. Price, and J. V. Hajnal, "Motion-corrected MRI with DISORDER: Distributed and incoherent sample orders for reconstruction deblurring using encoding redundancy," Magn. Reson. Med., vol. 84, pp. 713-726, 2020, propose a jittered checkerboard reordering scheme for 3D acquisitions (referred to herein as "checkered"). By uniformly distributing the samples of each shot across k-space, this reordering was shown to have computational advantages, including improved convergence stability and speed.

In the recently proposed NAMER algorithm (M. W. Haskell et al., "Network Accelerated Motion Estimation and Reduction (NAMER): Convolutional neural network guided retrospective motion correction using a separable motion model," Magn. Reson. Med., vol. 82, no. 4, pp. 1452-1461, 2019), a convolutional neural network that was trained to remove motion artifacts was included into the joint optimization. This improved the convergence speed, however, iterating between estimating the image and the motion parameters was still necessary for each of these approaches.

In "Scout Acquisition enables rapid Motion Estimation (SAME) for retrospective motion mitigation", Proceedings of ISMRM 28th Annual Meeting, 8-14 Aug. 2020, D. Polak, S. Cauley, B. Bilgic, D. N. Splithoff, P. Bachert, L. L. Wild and K. Setsompop propose a technique that utilizes a single rapid scout scan to drastically reduce the computation cost of motion estimation.

SUMMARY

It is therefore an object of embodiments of the present invention to provide a method of acquiring a three-dimensional magnetic resonance image dataset of an object having an improved sampling order in k-space, which lends itself to more robust and fast-converging retrospective motion correction. It is another object of embodiments of the present invention to provide a navigator-free retrospective motion estimation technique that facilitates clinically acceptable (for example <1 min) computation time for clinical protocols running on standard clinical reconstruction hardware.

These objects are met or exceeded by a method for acquiring a three-dimensional magnetic resonance image dataset of an object, using an imaging protocol in which several readout k-space lines are acquired in one shot, the imaging protocol comprising a plurality of shots, wherein spatial encoding is performed using phase encoding gradients along two spatial dimensions (which may define a phase encode plane), and frequency encoding along a third spatial dimension. The three-dimensional k-space comprises a central region and a periphery, and the sampling order of k-space lines differs between the central region and the periphery. At least one k-space line from each shot passes through the central region, whereas the periphery comprises regions which are sampled by k-space lines from a subset of the plurality of shots.

According to an embodiment of the acquisition method, a special sampling order (also referred to as "reordering", "reordering pattern", "reordering scheme" or "sampling pattern") in the centre of k-space may be combined with a more standard sampling order, such as linear, radial or spiral, for the rest of k-space. This allows more accurate motion estimation and correction using a retrospective (data-driven) motion correction technique, for example as described in the above-mentioned articles by Cordero-Grande and Haskell.

The imaging protocol is preferably three-dimensional (3D), wherein a thick slab of tissue is excited together, as opposed to multiple-slice MRI. In such 3D imaging, spatial encoding may be performed using phase encoding gradients along two spatial dimensions, and frequency encoding along the third spatial dimension, referred to as readout direction. A k-space line may be oriented in the frequency encoding direction. By modifying the phase encoding gradients before each readout, it is possible to design different sampling orders or reordering patterns, the order in which the k-space lines are acquired. Embodiments of the present invention employ Cartesian sampling, wherein k-space is sampled on a Cartesian grid.

The central region may have the shape of a cylinder extending in readout direction. The cylinder cross-section, i.e. its shape in the phase encode plane, may be square or rectangular, but may also be circular, honeycomb or diamond-shaped.

The imaging protocol may be any fast imaging protocol in which several k-space lines are acquired in one of a plurality of shots. A "shot" comprises an echo train, which may include several spin echoes and/or gradient echoes. One k-space line may be acquired during one echo, and there may be for example 64 to 512 preferably 128 to 256 echoes in one shot. The imaging protocol may comprise between e.g. 20 and 100 shots. The imaging protocol may use a multi-shot method, wherein a fraction of the 3D k-space is acquired in one shot, which may be after a single radio frequency (RF) excitation. Examples of such imaging protocols are 3D fast Spin-Echo, also termed SPACE ("Sampling Perfection with Application of optimized Contrast using flip angle Evolution") or MPRAGE (Magnetisation Prepared RApid Gradient Echo), which uses an inversion preparation followed by gradient echoes. For these non-steady-state sequences, i.e. in the presence of signal variation across the echo train due to T1/T2 relaxation, blurring is limited to a single axis, if the whole of k-space is sampled using a standard linear sampling order of k-space lines. Some embodiments of the present invention, in which the periphery of k-space is sampled in a linear sampling pattern, preserve as much as possible of this beneficial property. However, embodiments of the present invention may also be used on steady state sequences, such as Gradient Recalled Echo (GRE). For such imaging protocols, the sequence and the echo train is freely divided into shots, such that the echoes from each shot are assigned to one motion state, even though contrast does not vary over one shot. Preferably, the central region of k-space is sampled during the middle of the echo train. Preferably, high-resolution k-space data are acquired with the image protocol, for example having a resolution of between 0.5 and 4 $mm^3$ per voxel, preferably an isotropic resolution, for example 1 $mm^3$ isotropic resolution.

According to embodiments of the present invention, the sampling order of k-space lines differs between a central region and a periphery, wherein at least one—preferably several, e. g. 2-32, more preferred 8-16, k-space lines from each shot pass through the central region. This has the advantage that, when data-driven retrospective motion correction is applied, each of the shots, which are assigned different motion states, comprise data in the centre of k-space, where the low-resolution image content is encoded. This would not be the case for a purely linear sampling order, since some shots would cover only the periphery of k-space. On the other hand, it has been found that such a reordering pattern (e.g. "checkered") is not optimal for the whole of k-space. In the periphery, it has proven advantageous to use a sampling order that is more localized, such that the peripheral regions are sampled by k-space lines from a subset of the plurality of shots, and not by each of the shots. For example, a peripheral ⅛ of a plane through the 3D k-space may be sampled by ¼ of the shots, as would be the case by a linear sampling order.

The reordering scheme therefore ensures the stability of the motion parameter estimation in a retrospective motion correction, while preserving the clinical imaging contrast by minimizing deviations from standard, e.g. linear, reordering. The sampling order provides efficient convergence for both the motion estimation and the image reconstruction, thereby enabling retrospective motion correction in a clinically acceptable time frame of e.g. less than a minute. When using e.g. a motion correction method using a scout scan for motion estimation as described herein, this acquisition method allows each motion state to be independently determined through fully separable motion optimization across all shots.

The sampling order requires minimal modification of the sequence reordering and timing and can be implemented into a variety of 3D imaging protocols/sequences (both steady-state and non-steady-state). Moreover, the reordering, in particular the combination of "checkered" reordering in the central region and linear reordering in the periphery, improves the stability of the final image reconstruction when compared to pure checkered reordering and reduces residual parallel imaging artefacts. In summary, the method enables accurate navigator-free retrospective motion correction while retaining the sequence-specific contrast and blurring behaviour from standard clinical acquisitions.

According to an embodiment, the central region of k-space covers a region equivalent to a magnetic resonance image of low resolution, in particular having a pixel size of ≥3 mm or ≥4 mm, in particular 3 to 8 mm, preferably 4 to 5 mm in the phase encode directions. Thus, the central region, which is sampled differently than the periphery, corresponds to a low-resolution scout image. This preferably refers to the phase encoding directions, but may also refer to the readout direction. The central region of k-space, as seen in the phase-encode plane, may cover between ¼ and 1/32, more preferred ⅛ to 1/16 of the whole phase-encode plane. In total, the central region may cover between about ¼ and 1/32, preferably between ⅛ and 1/16, of k-space samples.

In an embodiment, the central region, when looked at in the phase encoding plane, comprises several tiles, wherein at least one k-space line from each shot passes through each of the tiles. This results in a jittered checkerboard (also referred to as "checkered") reordering across the centre of k-space. This embodiment may allow a shot-by-shot motion correction while also preserving the contrast and blurring properties of the purely linear reordering. Thus, each of the several tiles, which are sub-regions of the central region, is sampled by one k-space line from each shot or echo train. There may be for example between 4 and 32, preferably 9-16 tiles. The tiles may be rectangular or square in shape, though a different pattern, i. e. honeycomb or diamond shapes are also possible. The tiles may be non-overlapping, but overlap is also possible. The whole central region may be divided into tiles or sub-regions.

In an embodiment, the central region is sampled by changing one of the phase-encode gradient incrementally from one shot to the next, whereas the other phase-encoded gradient has big jumps between successive samples (k-space lines). It is possible to realize a checkered sampling pattern thereby.

According to an alternative embodiment, the central region is sampled in a radial sampling order, in which the k-space lines from one shot pass through one radial line on the phase encode plane. This reordering scheme will also result in the central region comprising a number of k-space lines from each shot.

Either of the above sampling orders for the central region may be combined with a sampling order of the periphery, in which one or both of the phase encoding gradients are changed incrementally from one k-space line to the next. In other words, the phase encode plane may be sampled by sweeping through it, rather than "jumping" from one point on the plane to another point which is not adjacent. Avoiding jumps will reduce eddy current effects that can cause artifacts in the image. For example, one phase encode gradient may change incrementally from one k-space line to the next, the other not at all, at least for most k-space lines.

In an embodiment, only one of the phase encoding gradients is changed from one k-space line to the next, i.e. a linear sampling order wherein one row or column of k-space lines which are linearly ordered along one phase-encoding direction, for example along $k_y$, is acquired in one shot. This incremental change of phase-encode gradients is advantageous especially for non-steady state sequences (e. g. MPRAGE, SPACE, etc.) as in the presence of signal variation across the echo train due to T1/T2 relaxation, blurring is limited to a single axis, namely the one in which the phase encoding gradients are changed incrementally from one echo to the next, here the $k_y$-axis. The phase-encode plane may (but must not be) be sampled along a Cartesian grid, in both the periphery and the central region.

In an embodiment, the periphery is sampled in a linear or radial sampling order, in which the k-space lines from one shot pass through one line or row on the phase encode plane. A checkered sampling order in the central region may be combined with a linear or radial sampling order in the periphery. A radial sampling order in the central region may combined with a linear sampling order in the periphery.

In an advantageous embodiment, the method further comprises acquiring a single low-resolution scout image of the object. Similar to the central region of k-space, the low-resolution scout image may have a spatial resolution of 2-8 mm, preferably 3-5 mm, for example 4 mm in the phase encode plane. The scout image may cover at least approximately the central region of k-space. For example, it may cover 70% to 130%, more preferred 90 to 110% of the central region of k-space. The low-resolution scout image is preferably a 3D image, which may be acquired with the same or a different imaging protocol than the (high resolution) 3D MR image dataset. The scout scan may have a similar or slightly differing contrast to the imaging protocol.

For example, the scout image may be acquired using parallel imaging accelerations of R=4 to R=12 at low spatial resolution of e. g. 1×4×4 mm$^3$)

When carrying out retrospective motion correction, the low-resolution scout image may be registered in k-space with the high-resolution 3D MR image dataset acquired using the imaging protocol (also referred to as "imaging data"), to obtain the desired motion parameters and simplify the minimisation problem. However, for those shots which only cover the periphery of k-space, there would be little common frequency information between the imaging data and the low-resolution scout, which degrades the accuracy of the motion correction. The sampling order overcomes this problem by incorporating a different sampling order in the centre of k-space. This ensures enough k-space overlap between the low-resolution scout and the high-resolution imaging data for every shot.

Therefore, a single ultra-fast scout scan (acquired in e. g. 2-6 sec using a 3D Turbo Spin-Echo sequence) may be used in retrospective motion correction in combination with the reordering pattern in order to completely avoid time-consuming joint optimization of motion and image vector. Therefore, this embodiment allows each motion state to be independently determined using fully separable motion optimizations across all shots. In addition to the computational and stability benefits of this approach, it creates the possibility of performing "on-the-fly" motion estimation immediately after each shot. For the final image reconstruction, the individual motion states from each shot may be combined and a standard least squares problem may be solved to obtain a motion-mitigated image.

In an embodiment, the imaging protocol uses a 3D parallel imaging technique, in which one or both of the phase encoding directions are subsampled by a predetermined acceleration factor, and the image dataset is acquired using a multi-channel coil array. Accordingly, the subsampling pattern may be incorporated into the forward model. For example, Wave-CAIPI (as disclosed in B. Bilgic et al., "Wave-CAIPI for highly accelerated 3D imaging," Magn. Reson. Med., vol. 73, no. 6, pp. 2152-2162, 2015) may be used.

In another aspect, embodiments of the present invention relate to a method for generating a motion-corrected three-dimensional magnetic resonance image dataset of an object. The method comprises:
  receiving multi-channel k-space data acquired in a multi-shot imaging protocol using a multi-channel coil array, in particular according to the acquisition method as described herein, and;
  estimating the motion-corrected three-dimensional image dataset and the rigid-body motion parameters for each shot by minimizing the data consistency error between the multi-channel k-space data acquired in the multi-shot imaging protocol and a forward model described by an encoding matrix, wherein the encoding matrix includes the effects of rigid-body motion for each shot, Fourier encoding, and optionally subsampling and coil sensitivities of the multi-channel coil array.

Accordingly, the motion correction method preferably uses imaging data acquired according to the method of claim 1. All features disclosed with regard to the acquisition method may be combined with all features of the motion-correction method and vice versa. Also, all features of the disclosed methods may be embodied in the MRI apparatus, computer program and computer-readable storage medium according to other aspects of embodiments of the present invention and vice versa.

The retrospective motion correction may be carried out as described in the above-cited articles by M. W. Haskell (TAMER and NAMER) as well as by L. Cordero-Grande. The minimisation problem is derived from a SENSE parallel imaging forward model, with rigid body motion parameters included. The SENSE forward model was introduced by K. P. Pruessmann, M. Weiger, M. B. Scheidegger, and P. Boesiger, "SENSE: sensitivity encoding for fast MRI," Magn. Reson. Med., vol. 42, no. 5, pp. 952-962, 1999.

In an embodiment, the method further comprises receiving a low-resolution scout image of the object, preferably acquired as described above, wherein the minimisation problem is carried out in two steps: in a first step, the rigid-body motion parameters for each shot are estimated using the low-resolution scout image. In a second step, the motion-corrected three-dimensional image is estimated using the rigid-body motion parameters estimated in the first step. Thereby, alternating, repeated updates of the otherwise coupled optimisation variables x (image vector) and θ (motion parameters) is avoided. Rather, this embodiment uses the rapid scout acquisition as image estimate x̃. This leads to a highly efficient optimisation problem that is fully separable across the shots and does not require repeated updates of x, which may comprise millions of imaging voxels. This optimisation scheme profits substantially from the sampling order, since there is substantial k-space overlap between the low-resolution scout image and the imaging data for every shot. However, this embodiment of a method for generating a motion-corrected 3D magnetic resonance image dataset of an object is also advantageously applied to multi-channel k-space data acquired using a standard sampling order, for example radial or linear reordering.

In an embodiment, the motion correction method is further combined with a method for estimating the background phase for each shot/motion state. This embodiment is advantageous for certain imaging sequences (e.g., gradient echo) which are susceptible to inhomogeneities of the main magnetic field, which often result in a large background phase that may vary under subject motion. The proposed method iteratively estimates the background phase for each shot/motion state by including a phase term into the encoding operator $E_\theta$ of the below formula 1. For example, the method may include estimating an initial image x̂ as disclosed herein. Then, individual projection images for each shot may be calculated by evaluating the forward SENSE+ motion model on the estimated image. Next, for each shot/motion state, the k-space data are partially replaced with the acquired scanner data and an Adjoint SENSE+ motion operation is applied to transform back to image space. This results in #shot projection images. One may use e.g. ESPIRiT (M. Uecker et al., "ESPIRiT—An eigenvalue approach to autocalibrating parallel MRI: Where SENSE meets GRAPPA," *Magn. Reson. Med.*, vol. 71, no. 3, pp. 990-1001, March 2014) to estimate any background phase differences across the projection images. The estimated phase difference may be used to compute a refined image by applying the estimated background phase in each shot/motion state.

In a further aspect of embodiments of the present invention, a magnetic resonance imaging apparatus comprises a radio frequency controller configured to drive an RF-coil comprising a multi-channel coil-array, a gradient controller configured to control gradient coils, and a control unit configured to control the radio frequency controller and the gradient controller to execute the multi-shot imaging protocol. The MRI-apparatus may be a commercially available MRI-apparatus which has been programmed to perform the method of embodiments of the present invention. For example, it may be 3T scanner like the MAGNETOM Vida of SIEMENS healthcare, Erlangen, Germany. A multi-channel coil array can for example be a 32-channel head coil, but may also be a coil array for spine-imaging.

According to a further aspect of embodiments of the present invention, a computer configured to generate a motion-corrected-three-dimensional magnetic resonance image dataset is provided. The computer comprises:

an interface configured to receive multi-channel k-space data acquired in a multi-shot imaging protocol using a multi-channel coil array, in particular according to the method of one of the preceding claims, and;

a processing unit configured to estimate the motion-corrected three-dimensional image dataset and the rigid-body motion parameters for each shot by minimizing the data consistency error between the multi-channel k-space data acquired in the multi-shot imaging protocol and a forward model described by an encoding matrix, wherein the encoding matrix includes the effects of rigid-body motion for each shot, Fourier encoding, and optionally subsampling and coil sensitivities of the multi-channel coil array.

The computer may be any computer comprising a sufficiently powerful processing unit, which may be a CPU or GPU, or several such processing units. Accordingly, the computer may be a PC, a server, a console of an MRI apparatus, but it also may be a computer that is remote from the MRI apparatus, it may be connected with it through the internet. Accordingly, the computer may also be a cloud computer, a remote server etc. The computer may also be a mobile device, such as a laptop, tablet computer or mobile phone.

According to a further aspect of embodiments of the present invention, a computer program is provided which includes program code, which causes a computer—such as the computer described herein—to execute the method, in particular the method for generating a motion-corrected-three-dimensional magnetic resonance image dataset. However, the program code may also encode an imaging protocol including the sampling order according to embodiments of the present invention.

According to a further aspect, embodiments of the present invention are directed to a non-transitory computer-readable medium containing a computer program as described herein. The computer-readable medium may be any digital storage medium, such as a hard disc, a cloud, an optical medium such as a CD or DVD, a memory card such as a compact flash, memory stick, a USB-stick, multimedia stick, secure digital memory card (SD) etc.

BRIEF DESCRIPTION OF THE DRAWINGS

The accompanying drawings illustrate various example methods and other example embodiments of various aspects of the present invention.

FIG. 12 shows a graph of the translation and rotation ground truth used in an experiment according to an embodiment of the present invention;

FIG. 13 shows a graph of translation and rotation error determined in an experiment according to an embodiment of the present invention;

FIG. 14 is a flow diagram of a method according to an embodiment of the present invention;

Similar elements are designated with the same reference signs in the drawing.

DETAILED DESCRIPTION

Figure 1:
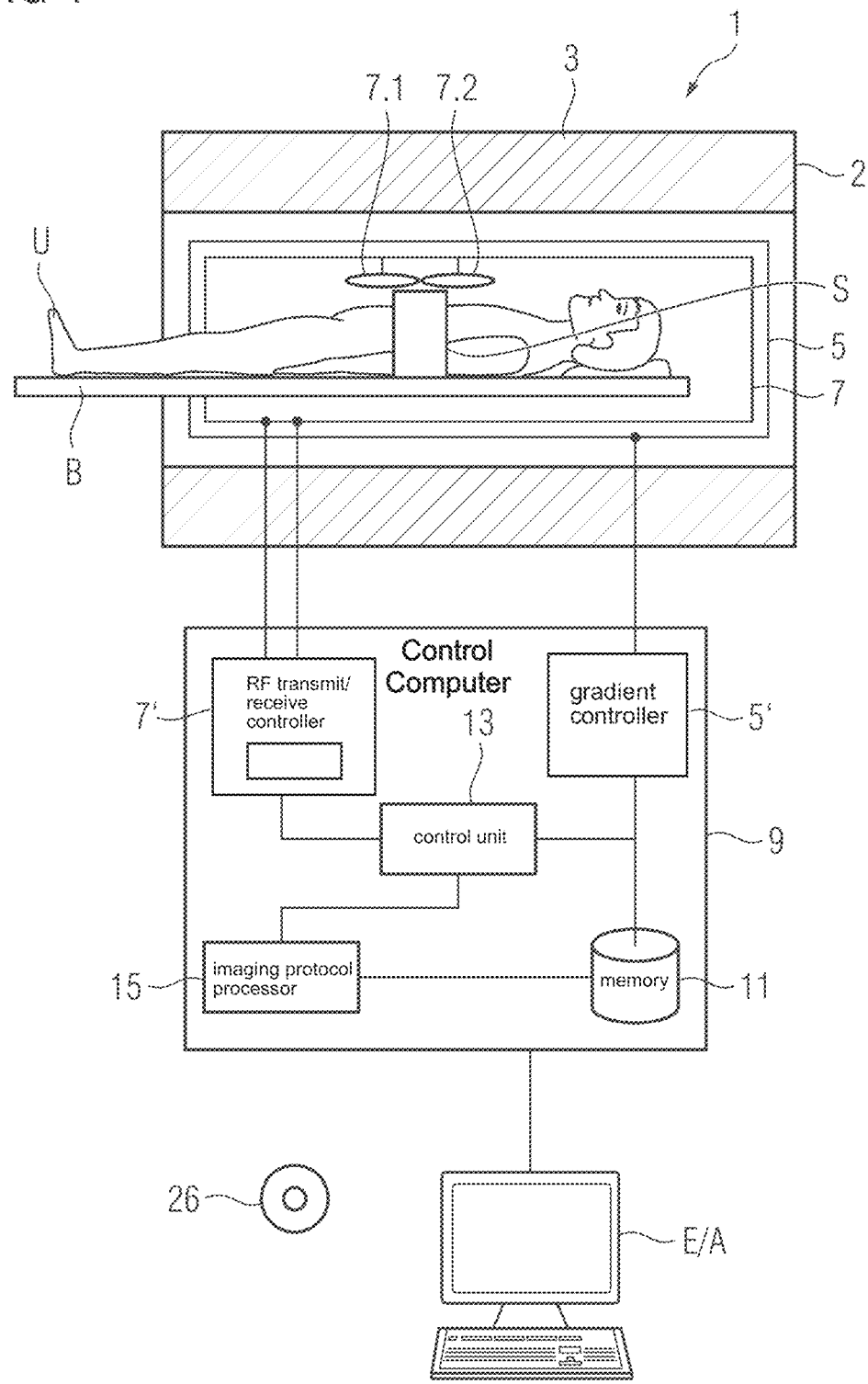
FIG. 1 is a schematic representation of an MRI apparatus according to an embodiment of the present invention.

FIG. 1 schematically shows a magnetic resonance (MR) apparatus 1. The MR apparatus 1 has an MR data acquisition scanner 2 with a basic field magnet 3 that generates the constant magnetic field, a gradient coil arrangement 5 that generates the gradient fields, one or several radio-frequency (RF) antennas 7 for radiating and receiving radio-frequency signals, and a control computer 9 configured to perform the method. In FIG. 1 such sub-units of the magnetic resonance apparatus 1 are only outlined schematically. The radio-frequency antennas 7 may include a coil array comprising at least two coils, for example the schematically shown coils 7.1 and 7.2, which may be configured either to transmit and receive radio-frequency signals or only to receive the radio frequency signals (MR signals).

In order to acquire MR data from an examination object U, for example a patient or a phantom, the examination object U is introduced on a bed B into the measurement volume of the scanner 2. The slab S is an example of a 3D slab of the examination object, from which MR data can be acquired using a method according to an embodiment of the present invention. The control computer 9 centrally controls the magnetic resonance apparatus 1, and can control the gradient coil arrangement 5 with a gradient controller 5' and the radio-frequency antenna 7 with a radio-frequency transmit/receive controller 7'. The radio-frequency antenna 7 has multiple channels corresponding to the multiple coils 7.1, 7.2 of the coil arrays, in which signals can be transmitted or received. The radio-frequency antenna 7 together with its radio-frequency transmit/receive controller 7' is responsible for generating and radiating (transmitting) a radio-frequency alternating field for manipulating the nuclear spins in a region to be examined (in particular in the slab S) of the examination object U. The control computer 9 also has an imaging protocol processor 15 that determines the reordering pattern according to an embodiment of the present invention. A control unit 13 of the control computer 9 is configured to execute all the controls and computation operations required for acquisitions. Intermediate results and final results required for this purpose or determined in the process can be stored in a memory 11 of the control computer 9. The units shown here should not necessarily be considered as physically separate units, but simply represent a subdivision into functional units, which can also be implemented by fewer physical units, or just one. A user can enter control commands into the magnetic resonance apparatus 1 and/or view displayed results, for example image data, from the control computer 9 via an input/output interface E/A. A non-transitory data storage medium 26 can be loaded into the control computer 9, and may be encoded with programming instructions (program code) that cause the control computer 9, and the various functional units thereof described above, to implement any or all embodiments of the method according to embodiments of the present invention, as also described above.

Figure 2:
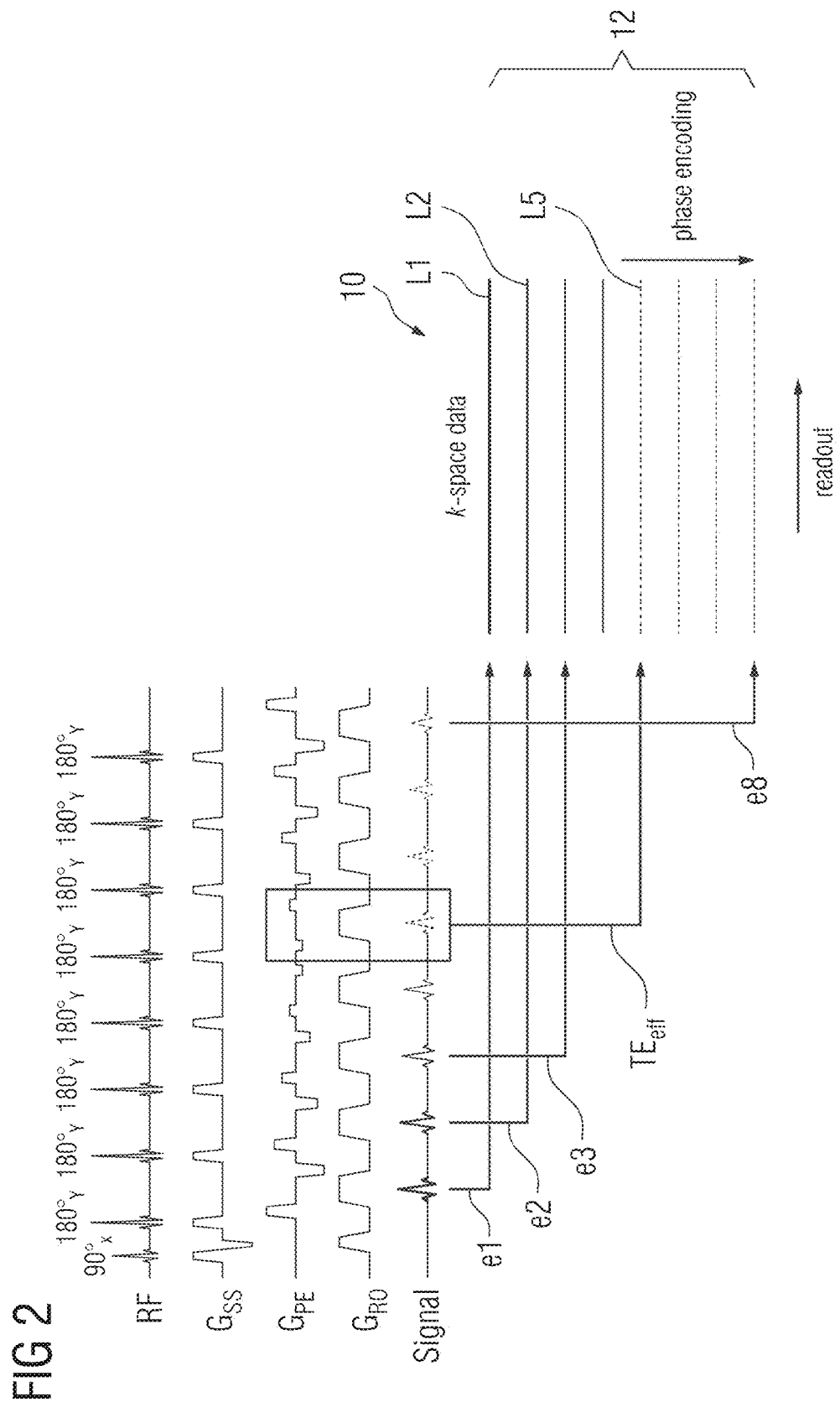
FIG. 2 is a sequence diagram of a Turbo (Fast) spin-echo imaging protocol.

FIG. 2 shows a sequence diagram illustrating a Fast Spin-Echo sequence, in which a 90° pulse is followed by a train of 180° refocusing pulses, as shown on the line names "RF". For illustration purpose, this a 2D sequence, therefore the RF pulses are transmitted concurrently with a slice select gradient $G_{ss}$. The train of refocusing RF pulses leads to an echo train e1, e2, e3, . . . show in the signal row. Each of these echoes is used to acquire one k-space line 12 in the two-dimensional k-space 10, wherein echo e1 corresponds to line L1, line e2 corresponds to line L2, echo e3 corresponds to k-space line L3 etc. In order to distribute the k-space lines 12 around the two-dimensional k-space 10, phase encode gradients $G_{PE}$ are used, which are incrementally changed for each echo. During acquisition, a readout gradient $G_{RO}$ is applied. The echoes e1, e2, . . . , e8 have a signal intensity which diminishes over the echo train due to T2 relaxation. The contrast of the final image is determined by the echo which is acquired in the centre of k-space, in this case e5 corresponding to L5. The time after the 90° pulse of this echo determines the effective echo time, $TE_{eff}$.

If a Fast Spin-Echo imaging protocol is performed in 3D, the slice select gradient may be applied only once during the 90° pulse, in order to select one slab S. The further slice select gradients are replaced by a further phase encode gradient in a direction orthogonal to the 2D phase encode and the slice select gradient, so that phase encoding is performed in two spatial directions, leading to the distribution of the k-space lines 12 across a volume, rather than a plane 10.

Figure 3:
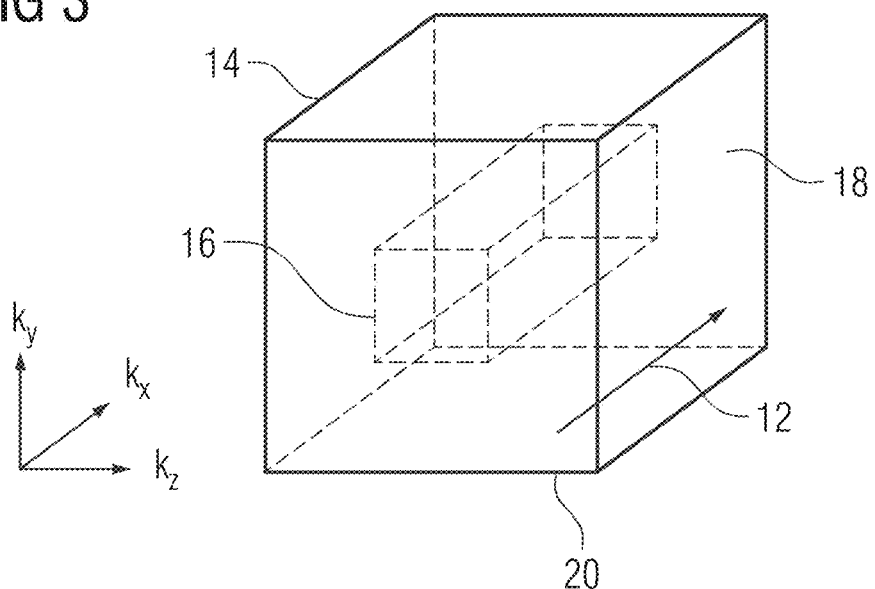
FIG. 3 is a schematic representation of three-dimensional k-space.

FIG. 3 illustrates such three-dimensional k-space 14 having directions $k_x$ in readout direction, and $k_y$ and $k_z$ in the phase encode plane 20. A k-space line acquired during one echo is illustrated at 12. The k-space volume 14 is divided into a central region 16 and a periphery 18. Since the full acquisition in readout direction does not cost additional imaging time, usually the central region 16 will extend along the full length of the volume in readout direction $k_x$. However, in the phase encode plane 20, which in this illustration is oriented in the plane of the paper, the central region 16 covers only about ⅑ of the total square phase encode plane 20. The illustrated k-space line 12 is in the periphery 18.

According to an embodiment of the present invention, the pattern or sampling order in which k-space lines 12 are acquired in the central region 16 and in the periphery 18 are different from one another. In particular, each echo train must comprise one k-space line in the central region 16, whereas this is not true for regions of equal or comparable size to the central region, which are situated in the periphery 18.

Figure 4:
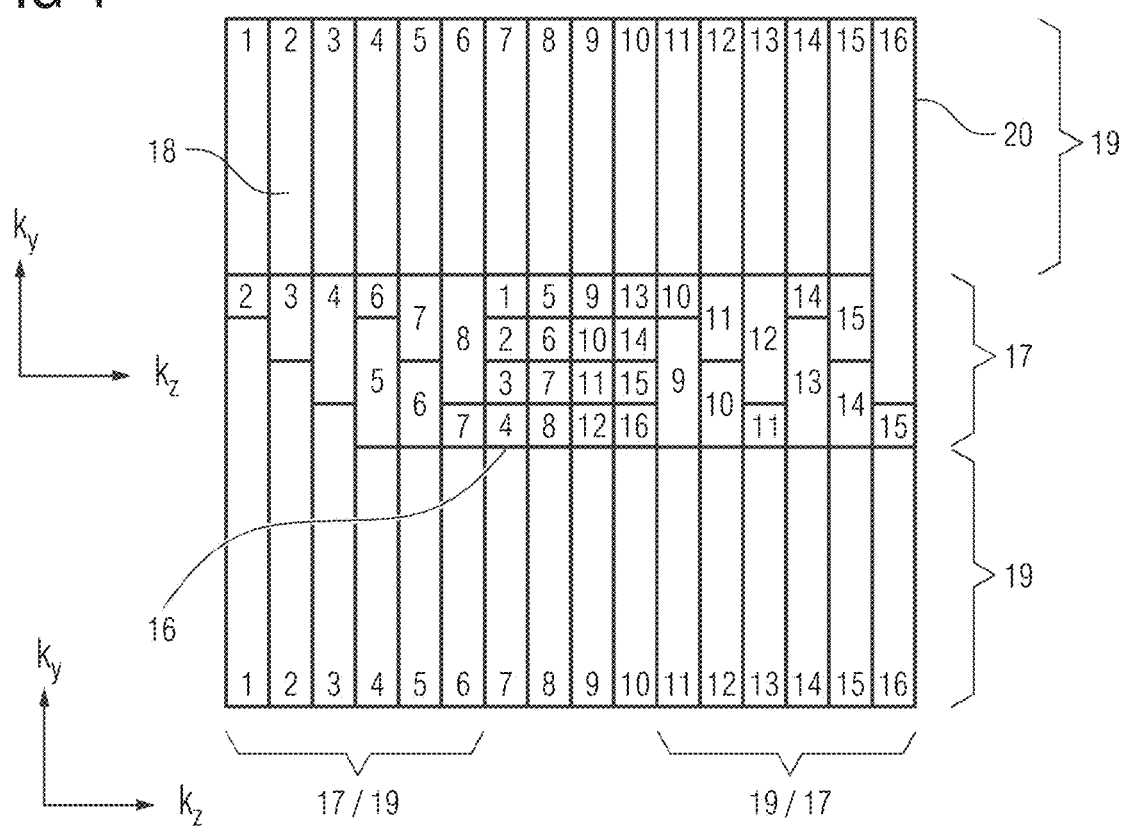
FIG. 4 is a schematic representation of the phase encode plane illustrating a sampling order according to an embodiment of the present invention.

An example sampling order is illustrated in FIG. 4, which shows a view onto the phase encode plane 20 (the readout direction is perpendicular to the plane of the drawing). The numbers 1-16 indicate shots or echo trains, i.e. there are 16 shots. During each shot, one phase-encode gradient (here $k_y$) is changed incrementally from one echo to the next, so that the k-space is swept through linearly in $k_y$ direction. However, the phase encoding in the orthogonal direction, here $k_z$, differs significantly from a linear encoding pattern, in that each shot has one k-space line in the central region 16, which in total covers 4×4=16 k-space lines. Evidently, this is just an illustration, as there will usually be more than 16 shots and 16 steps in $k_y$, resulting in more than a total of 16×16=256 k-space lines. Thus, in the periphery 18, the areas 19, which are the areas along one phase encode direction (here $k_y$) which are outside the central region, are sampled according to a purely linear sampling pattern. In the regions 17, which are outside the central region 16, but on the same height in $k_y$ direction, the sampling is not entirely linear, but somewhat compressed to leave space for the central region 16. FIG. 4 is just an illustration of a possible sampling pattern and many different implementations are possible.

Figure 5:
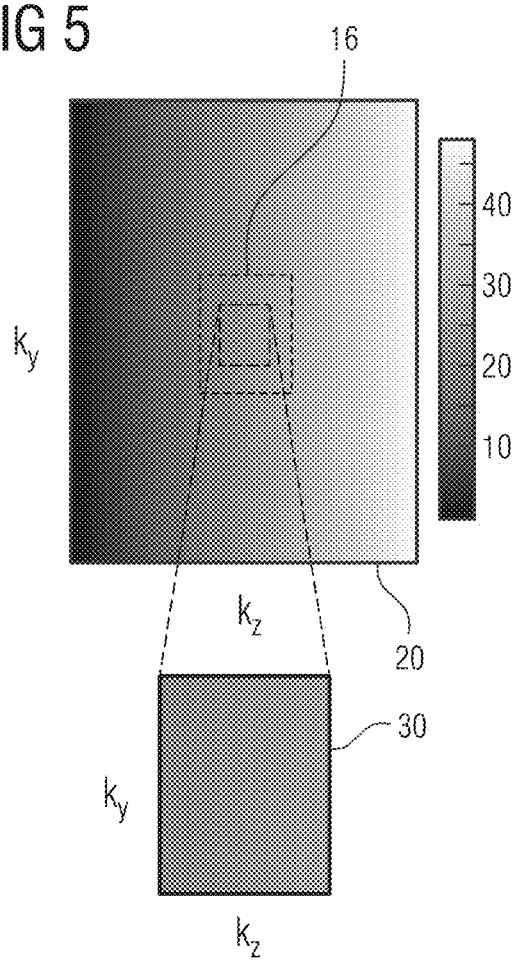
FIG. 5 is a representation of the phase encode plane illustrating a linear sampling order.
Figure 7:
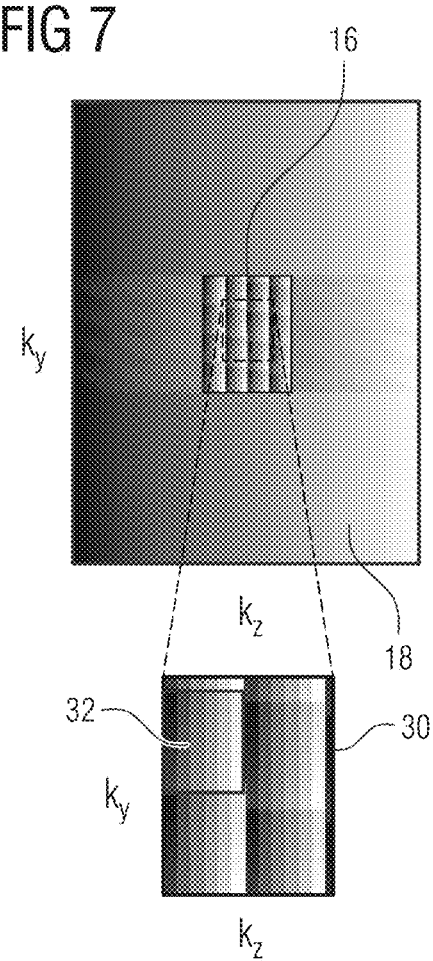
FIG. 7 illustrates a linear+checkered sampling order in the phase encode plane according to an embodiment of the present invention.
Figure 6:
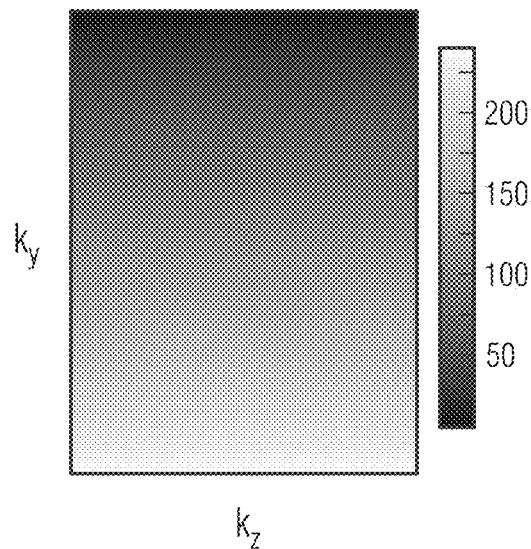
FIG. 6 is a representation of the phase encode plane illustrating a linear sampling order.
Figure 8:
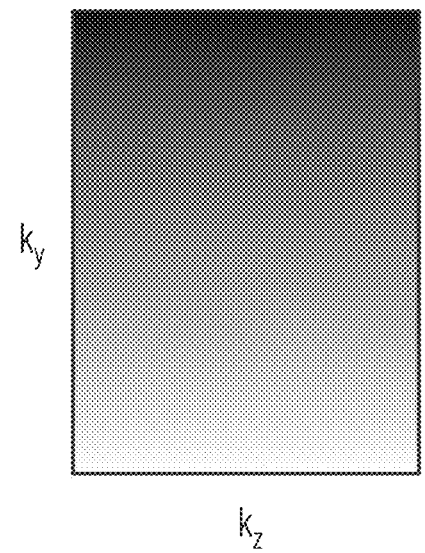
FIG. 8 illustrates a linear+checkered sampling order in the phase encode plane according to an embodiment of the present invention.

FIGS. 5 to 8 further illustrate different sampling patterns/reordering schemes: FIGS. 5 and 6 show a linear reordering, whereas FIGS. 7 and 8 show a linear plus checkered reordering. The figures show a view onto the phase encode plane 20, as shown in FIG. 4. However, the number of the shots and the number of the echoes is greyscale-encoded: in FIGS. 5 and 7, the colour or greyscale indicates the shot number, with the 1th shot shown black and the 48th shot shown in white. A section 30 of the central k-space region 16 is shown enlarged in the bottom part of FIGS. 5 and 7. In FIGS. 6 and 8, by contrast, the greyscale indicates the echo number within one shot, wherein the first echo at each shot is coloured black and the last echo is coloured white. FIGS. 5 and 6 illustrate a linear sampling order, in which the central region 16, which appears relatively uniformly grey, is only covered by about shots number 20-30. On the other hand, shots 1-20 and shots 30-48 do not go through the central region and therefore have no overlap with, for example, a low-resolution scout image. FIGS. 7 and 8, on the other hand, show a sampling order according to an embodiment of the present invention, namely linear plus checkered. This combines jittered checkerboard sampling in the central region 16 of k-space with linear sampling across the remainder of k-space. This retains the desirable linear signal evolution along $k_y$, and in non-steady-state-sequences will lead to similar contrast and blurring as obtained from a purely linear reordering. The nature of the checkered sampling order in the centre of k-space is well visible from the enlarged section 30. The central region 16 is further divided into a number of rectangular tiles 32, wherein 4 tiles 32 are visible in the enlarged section 30. Each tile 32 includes one k-space line from each of the total number of shots (in this case 48). By contrast, if the whole of k-space were acquired in a checkered reordering, the signal evolution within each shot might follow a linear trend, but may exhibit undesirable steps.

Figure 9:
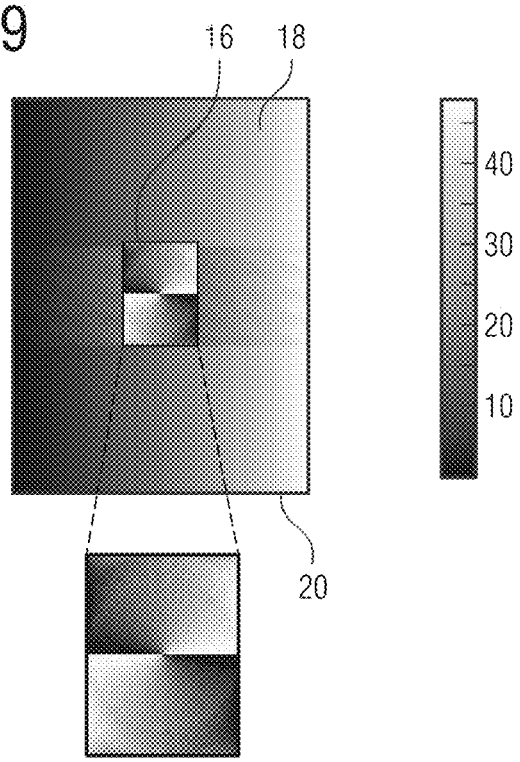
FIG. 9 illustrates a linear+radial sampling order in the phase encode plane according to an embodiment of the present invention.

A further embodiment is shown in FIG. 9, in which a radial reordering in the central region 16 of k-space is combined with a linear reordering in the periphery. The grey scale again illustrates the shot number, with black showing the 1st shot and white the 48th shot. Also, with this reordering, the central region of k-space is covered by all shots.

Figure 10:
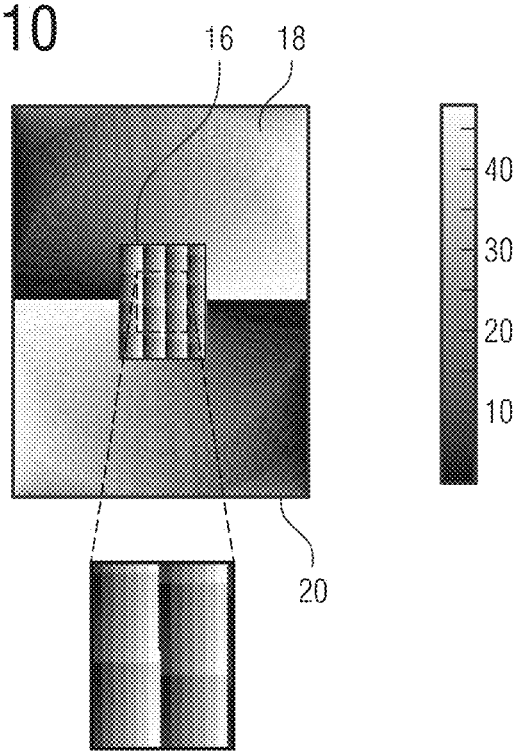
FIG. 10 illustrates a radial+checkered sampling order in the phase encode plane according to an embodiment of the present invention.

A still further implementation is illustrated in FIG. 10, which shows a checkered reordering in the central region 16 of k-space, combined with a radial reordering in the periphery 18.

Figure 11:
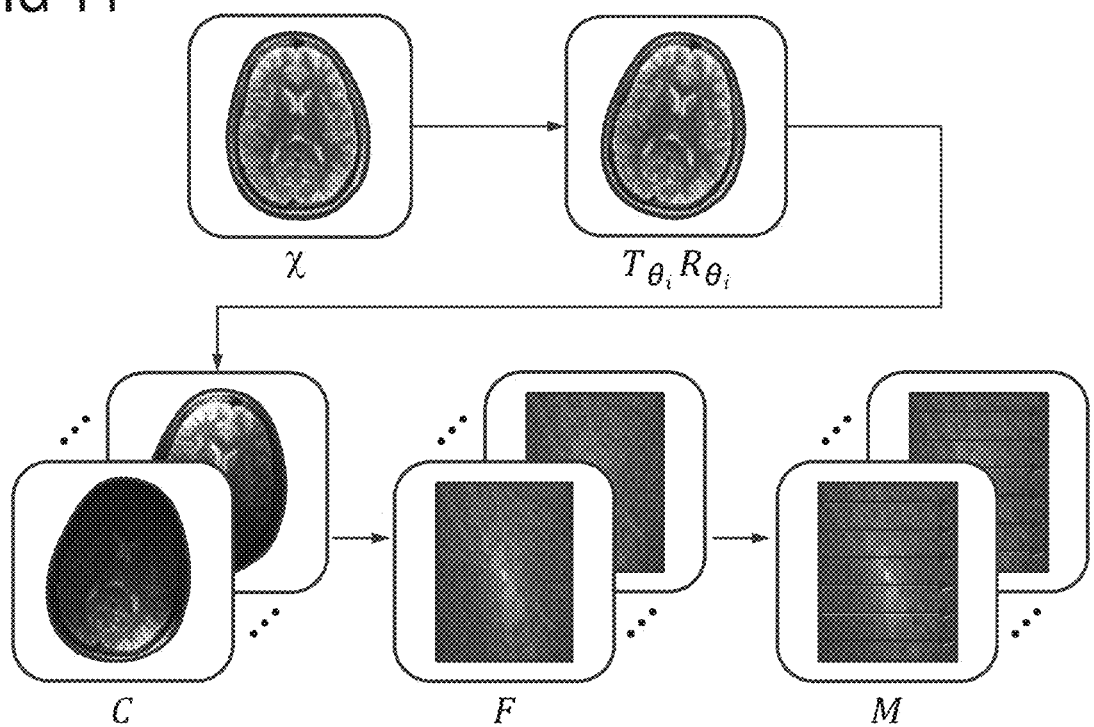
FIG. 11 is a flow diagram illustrating the Forward Model used.

The retrospective motion correction technique will now be illustrated with reference to FIG. 11. The mathematical model used is an extension of SENSE parallel imaging, as described in the above-cited paper by K. P. Pruessmann et al., with rigid-body motion parameters included into the forward model. The encoding operator $E_\theta$ for a given patient motion trajectory θ relates the motion free image x to the acquired multi-channel k-space data s. FIG. 11 illustrates the mathematical components which contribute to the encoding at each shot. Note, that for each shot i the subject's position is described by a new set of six rigid-body motion parameters $\theta_i$ that describe the 3D position of the object. Accordingly, the multi-channel k-space data $s_i$ for a given shot i may be related to the 3D image volume x through image rotations $R_i$, image translations $T_i$, coil sensitivity maps C, Fourier operator F and under-sampling mask $M_i$ by the following formula 1

$$s_i = E_{\theta_i} x = M_i F C T_{\theta_i} R_{\theta_i} x \qquad [1]$$

Using an ultra-fast low-resolution scout scan, the method according to an embodiment of the present invention creates an efficient method for directly estimating the motion trajectory θ, thus completely avoiding time-consuming alternating optimization between the image vector (formula 2) and the motion vector (formula 3):

$$[\hat{x}] = \mathrm{argmin}_x \|E_\theta x - s\|_2 \qquad [2]$$

$$[\hat{\theta}] = \mathrm{argmin}_\theta \|E_\theta \hat{x} - s\|_2 \qquad [3]$$

Prior art methods require repeated updates of the coupled optimization variables x and θ, using the formulas 2 and 3. This can lead to convergence issues as updates of x and θ will be computed on inaccurate information. Moreover, the reconstruction is computationally demanding as repeated updates of x (millions of imaging voxels) are needed If, however, a low resolution scout image is acquired, the scout $\tilde{x}$ approximates the motion-free image volume $\hat{x}$ and each motion state can be determined independently by minimizing the data consistency error of the forward model:

$$[\hat{\theta}_i] = \mathrm{argmin}_{\theta_i} \|E_{\theta_i} \tilde{x} - s_i\|_2 \qquad [4]$$

For the final image reconstruction, the individual motion states from each shot are combined and the motion-mitigated image is obtained from solving a standard least-squares problem:

$$[\hat{x}] = \mathrm{argmin}_x \|E_\theta x - s\|_2 \qquad [5]$$

This strategy completely avoids the difficult non-linear and non-convex joint optimization that contains millions of unknowns, as it only considers six rigid body parameters per motion optimization, and it does not require computationally costly full or partial updates to the image.

This framework may also be extended to Wave-CAIPI encoding. This method exploits available information in modern multi-channel receivers and may provide up to R=9-fold speedup for many important clinical contrasts. The sinusoidal gradients in Wave-encoding lead to a spatially varying phase that is applied along the read-out in hybrid space. Using the notation from the encoding model of formula [1]

$$E_{\theta_i} = M_i F_{yz} P_{yz} F_x C T_{\theta_i} R_{\theta_i} \qquad [6]$$

where the Fourier transform has been modified to contain the Wave point-spread-function $P_{yz}$.

In Vivo Experiments

A sequence reordering according to FIGS. 7 and 8, i.e. linear+checkered reordering was introduced into a T2-weighted SPACE sequence as well as an MPRAGE sequence, which were acquired at 1 mm³ isotropic resolution and R=4 acceleration. A contrast-matched, low-resolution T2-weighted scout scan (1×4×4 mm³ resolution and R=4-fold acceleration) preceded every imaging scan. The method was also extended to Wave-CAIPI. In vivo scans of the head were performed on a healthy subject using a 3D-scanner and a 32-channel head coil. The subject was instructed to move throughout the scan. The details of the imaging protocols and scout scans are shown in the below table 1:

TABLE 1

Imaging and scout acquisition parameters for MPRAGE and SPACE. The scout acquisition includes a 2 s external GRE reference scan which was used to estimate coil sensitivity maps. In all SPACE acquisitions (scout and imaging scan) a separate dummy shot was obtained to achieve steady-state magnetization.

|  |  | MPRAGE | Wave MPRAGE | T2w SPACE | SPACE-FLAIR |
|---|---|---|---|---|---|
| Scout scan | Resolution [mm] | 1 × 4 × 4 | 1 × 4 × 4 | 1 × 4 × 4 | 1 × 4 × 4 |
|  | Acceleration | 4 × 3 | 4 × 3 | 4 × 3 | 4 × 3 |
|  | Turbo factor | 256 | 256 | 256 | 256 |
|  | Acquisition time [min] | 0:04 | 0:04 | 0:08 | 0:12 |
| Imaging scan | Resolution [mm] | 1 × 1 × 1 | 1 × 1 × 1 | 1 × 1 × 1 | 1 × 1 × 1 |
|  | Acceleration | 2 × 2 | 3 × 2    3 × 3 | 2 × 2 | 2 × 2 |
|  | Turbo factor | 192 | 192 | 240 | 240 |
|  | Acquisition time [min] | 2:40 | 1:45    1:10 | 2:37 | 4:05 |
| Scout & imaging scan | $TE_{eff}$/TI/TR [ms] | 3.5/1100/2500 | 3.5/1100/2500 | 104/—/3200 | 104/—/5000 |
|  | FOV [mm] | 256 × 256 × 192 | 256 × 256 × 192 | 256 × 256 × 192 | 256 × 256 × 192 |
|  | Bandwidth [Hz/px] | 200 | 200 | 592 | 592 |
|  | Wave amp. [mT/m] | — | 8 | — | — |
|  | Wave #cycles | — | 17 | — | — |

To reduce the computational footprint of the motion optimization, coil compression was employed, i.e. the multichannel k-space data was compressed to a lower number of coils using SVD compression.

The minimisation may be performed using MATLAB's fminunc, which is a standard implementation of a quasi-newton optimisation algorithm for non-linear programming. Alternatively, a custom gradient descent optimizer was used for each shot i according to the pseudo code provided below. In this optimization, after initialization of the motion values, the gradient $\nabla_{\theta_i}$ of the motion values is computed using finite differences. Next, the optimal step size $\Delta\tilde{s}$ for the gradient update is estimated by sampling data-consistency (dc) errors across a small set of possible step sizes. A second order polynomial fit is used to identify the step size $\Delta\tilde{s}$ with the lowest model error and the motion vector is updated accordingly $\theta_i \rightarrow \theta_i + \Delta\tilde{s}\nabla_{\theta_i}$. This process repeats until convergence is reached, e.g., while iteration k<$k_{max}$ or data consistency improvement $\Delta\in < \Delta\in_{min}$, wherein $k_{max}$ is a predetermined maximum number of iterations for each optimisation step. The performance of the optimizer was determined by comparing the number of forward model evaluations required to achieve a desired level of motion estimation accuracy.

While shot i<$N_{sh}$
  Initialize motion values $\theta_i$.
  While k<$k_{max}$ & $\Delta\in < \Delta\in$min
    1. Calculate gradient $\nabla_{\theta_i}$ using finite differences
    2. Estimate step size $\Delta\tilde{s}$
      a. Compute data-consistency (dc) error across a small set of possible step sizes
      b. Fit second order polynomial across dc errors
      c. Find step-size $\Delta\tilde{s}$ with minimum dc error
    3. Project and update motion parameters: $\theta_i \rightarrow \theta_i + \Delta\tilde{s}\nabla_{A_i}$
    4. Compute dc error: $\in_i = \|E_{\theta_i}\tilde{x} - s_i\|$ The results of the motion estimation for several sequence reorderings are shown in FIGS. 12 and 13. FIG. 12 shows the ground truth of the motion, on top the translation in mm, on the bottom the rotation in °, which the subject performed during the scan. Several sampling patterns were investigated and their ability to perform accurate motion estimation and correction was analysed, namely a purely linear sequence reordering, a purely radial reordering, a purely checkered reordering and a linear+checkered reordering (according to an embodiment of the present invention). The results are shown in FIG. 13. The errors in the motion correction for translation and rotational vectors are shown for the linear reordering 40, the radial reordering 42, a checkered reordering 44, and a linear+checkered reordering 46, as illustrated in FIG. 7. The most commonly used linear reordering scheme suffers from estimation inaccuracy due to insufficient spectral frequency overlap between the low-resolution scout and the acquired k-space data. Especially near the boundaries of k-space, missing overlap between the scout and the acquired data causes the fully separable motion optimisation to become infeasible. Accordingly, for these shots, effectively no motion estimation was possible. As the distribution of k-space samples per shot broadens, the motion estimations accuracy improves. For example, in radial reordering 42, each shot has some overlap with the low-resolution region of k-space that the scout image occupies, which generally resulted in better motion estimation accuracy. However, deviations between the estimated and ground truth parameters were observed for some of the translation values. This is because spectral frequency support is limited to the radial $k_y$, $k_z$ sampling direction, but unavailable in the orthogonal direction. The most accurate motion estimates were obtained from checkered 44 and linear+checkered 46 reordering, as spectral frequency support is now provided along all three spatial dimensions, yielding negligible motion estimation arrays across all shots. Beside the emotion estimation ability, the sampling pattern also affects the convergence of the image reconstruction. Compared to the other sampling patterns, the linear+checkered sampling scheme converges more rapidly, i.e. after fewer iterations, than a reconstruction with checkered sampling. This can also be seen in the reconstructed images, where linear+checkered sampling had fewer artifacts then checkered reordering.

FIG. 14 shows a flow diagram of a method according an embodiment of the present invention. In step 60, a low-resolution scout image is acquired, and in step 62, the multi-shot 3D-imaging protocol is used to acquire k-space data of the object. Steps 60 and 62 may also be done in reverse order, i.e. the scout image may be acquired after the high-resolution image data. The scout image is reconstructed using a parallel imaging reconstruction method, but without motion correction, to obtain a low-resolution 3D image in step 63. This image and the multi-channel k-space data are then used in step 64, where motion estimation is carried out according to formula [4], wherein the low-resolution scout image is used as an estimate for x and the motion parameters are estimated using an optimisation for each shot. In step 66, these estimated motion parameters are then used on the acquired multi-channel k-space data, and the motion-corrected 3D image is reconstructed, for example according to formula [5]. In step 68, the motion-corrected image may be displayed to a user, for example on the screen of an E/A device according to FIG. 1.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although the present invention has been disclosed in the form of embodiments and variations thereon, it will be understood that numerous additional modifications and variations could be made thereto without departing from the scope of the present invention.

What is claimed is:

1. A method comprising:
acquiring a three-dimensional magnetic resonance image dataset of an object, using an imaging protocol in which several k-space lines are acquired in one shot, the imaging protocol including a plurality of shots,
wherein spatial encoding is performed using phase encoding gradients along two spatial dimensions, and using frequency encoding along a third spatial dimension,
wherein the k-space is a three-dimensional k-space including a central region and a periphery,
wherein a sampling order of the k-space lines differs between the central region and the periphery,
wherein at least one k-space line from each of the plurality of shots passes through the central region, and
wherein the periphery includes regions which are sampled by k-space lines from a subset of the plurality of shots.

2. A method for generating a motion-corrected three-dimensional magnetic resonance image dataset of an object, the method comprising:
receiving multi-channel k-space data acquired in a multi-shot imaging protocol using a multi-channel coil array, according to the method of claim 1; and
estimating the motion-corrected three-dimensional image dataset and rigid-body motion parameters for each shot by minimizing a data consistency error between the multi-channel k-space data acquired in the multi-shot imaging protocol and a forward model described by an encoding matrix, wherein
the encoding matrix includes at least one of effects of rigid-body motion for each shot, Fourier encoding, subsampling or coil sensitivities of the multi-channel coil array.

3. The method of claim 1, wherein the central region covers a region equivalent to a magnetic resonance image of low resolution.

4. The method of claim 1, wherein
the central region, as defined in a phase encoding plane, includes several tiles, and
at least one k-space line from each of the plurality of shots passes through each of the several tiles.

5. The method of claim 1, wherein the periphery is sampled in a sampling order, in which one or more of the phase encoding gradients are changed incrementally from one k-space line to a next k-space line.

6. The method of claim 1, wherein the periphery is sampled in a linear sampling order, in which the k-space lines from one shot pass through one row or column on a phase encoding plane.

7. The method of claim 1, wherein the periphery is sampled in a radial sampling order, in which the k-space lines from one shot pass through one radial line on a phase encoding plane.

8. The method of claim 1, further comprising:
acquiring a single low resolution scout image of the object.

9. The method of claim 1, wherein the imaging protocol uses a three-dimensional parallel imaging technique, in which one or more phase encoding directions are sub-sampled by an acceleration factor, and the three-dimensional magnetic resonance image dataset is acquired using a multi-channel coil array.

10. The method of claim 2, further comprising:
receiving a low-resolution scout image of the object, and
wherein the minimizing a data consistency error includes estimating the rigid-body motion parameters for
each shot using the low-resolution scout image, and estimating the motion-corrected three-dimensional image using the rigid-body motion parameters.

11. A magnetic resonance imaging apparatus configured to execute the method of claim 1, the magnetic resonance imaging apparatus comprising:
a radio frequency controller configured to drive an RF coil including a multi-channel coil array,
a gradient controller configured to control gradient coils, and
a control unit configured to control the radio frequency controller and the gradient controller to execute the imaging protocol.

12. A computer configured to generate a motion-corrected three-dimensional magnetic resonance image dataset, the computer comprising:

an interface configured to receive multi-channel k-space data acquired in a multi-shot imaging protocol according to the method of claim 1 and using a multi-channel coil array;

at least one processor configured to estimate the motion-corrected three-dimensional magnetic resonance image dataset and rigid-body motion parameters for each shot by minimizing a data consistency error between the multi-channel k-space data acquired in the multi-shot imaging protocol and a forward model described by an encoding matrix, wherein the encoding matrix includes at least one of the effects of rigid-body motion for each shot, Fourier encoding, subsampling or coil sensitivities of the multi-channel coil array.

13. A non-transitory computer-readable storage medium storing computer executable instructions that, when executed by a processor, cause the processor to execute the method according to claim 1.

14. The method of claim 3, wherein the central region covers a region equivalent to a magnetic resonance image having a pixel size of ≥3 mm.

15. The method of claim 3, wherein
the central region, as defined in a phase encoding plane, includes several tiles, and
at least one k-space line from each of the plurality of shots passes through each of the several tiles.

16. The magnetic resonance imaging apparatus of claim 11, wherein the central region covers a region equivalent to a magnetic resonance image of low resolution.

17. The magnetic resonance imaging apparatus of claim 11, wherein
the central region, as defined in a phase encoding plane, includes several tiles, and
at least one k-space line from each of the plurality of shots passes through each of the several tiles.

18. The magnetic resonance imaging apparatus of claim 11, wherein the periphery is sampled in a sampling order, in which one or more of the phase encoding gradients are changed incrementally from one k-space line to a next k-space line.

19. The magnetic resonance imaging apparatus of claim 11, wherein the periphery is sampled in a linear sampling order, in which the k-space lines from one shot pass through one row or column on a phase encoding plane.

20. The magnetic resonance imaging apparatus of claim 11, wherein the periphery is sampled in a radial sampling order, in which the k-space lines from one shot pass through one radial line on a phase encoding plane.

\* \* \* \* \*